(12) United States Patent
Eagar

(10) Patent No.: US 6,495,993 B2
(45) Date of Patent: Dec. 17, 2002

(54) CIRCUITRY FOR IMPROVING THE EFFICIENCY OF A SWITCHING REGULATOR BY REDUCING REVERSE RECOVERY CURRENT

(75) Inventor: Dale R. Eagar, Black Forest, CO (US)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 09/789,866

(22) Filed: Feb. 20, 2001

(65) Prior Publication Data

US 2002/0135341 A1 Sep. 26, 2002

(51) Int. Cl.[7] ................................................. G05F 1/59
(52) U.S. Cl. ........................ 323/271; 323/282; 323/351
(58) Field of Search ................................. 323/271, 282, 323/351

(56) References Cited

U.S. PATENT DOCUMENTS

| | | | |
|---|---|---|---|
| 3,652,874 A | | 3/1972 | Partridge ............... 307/252 M |
| 5,457,379 A | * | 10/1995 | Jacobs et al. ............... 323/282 |
| 6,051,961 A | * | 4/2000 | Jang et al. .................. 323/271 |
| 6,087,817 A | * | 7/2000 | Varga ......................... 323/282 |
| 6,094,038 A | * | 7/2000 | Lethellier ................... 323/271 |
| 6,188,209 B1 | * | 2/2001 | Poon et al. ................. 323/282 |
| 6,249,156 B1 | * | 6/2001 | Attwood ..................... 323/282 |
| 6,259,235 B1 | * | 7/2001 | Fraidlin et al. ............. 323/282 |

OTHER PUBLICATIONS

"Step–Down Switching Regulator," LT1074/LT1076 Data Sheet, Dec. 1994, vol. III, pp. 4–243–256.

* cited by examiner

*Primary Examiner*—Jeffrey Sterrett
(74) *Attorney, Agent, or Firm*—Fish & Neave; Robert W. Morris; Jeffrey D. Mullen

(57) ABSTRACT

Recovery systems and methods of the present invention include circuitry that transfers energy from an input to an output with reduced power dissipation. A synchronous switching regulator is one application for the recovery system of the present invention. An inductor may be used in a synchronous switching regulator to reduce power dissipation caused by reverse recovery current that flows through the body diode of the synchronous switching transistor when the synchronous switching transistor turns OFF. Energy in the inductor may be transferred back to the input or output capacitor of the switching regulator through a recovery system of the present invention. The recovery circuit of the present invention provides an efficient method for intercepting energy in the inductor, and presenting power to a recovery switcher in a manner that allows the recovery switcher to transfer the energy into the input or output capacitor of the switching regulator efficiently.

57 Claims, 2 Drawing Sheets

CIRCUITRY FOR IMPROVING THE EFFICIENCY OF A SWITCHING REGULATOR BY REDUCING REVERSE RECOVERY CURRENT

BACKGROUND OF THE INVENTION

This invention relates to circuitry and methods for improving the efficiency of a switching regulator. More specifically, this invention relates to circuitry and methods that recover energy that would otherwise be lost.

A recovery switcher is a switching regulator circuit that transfers energy from an input voltage source to an output voltage through an inductor. A recovery switcher typically has a low input impedance and a high output impedance. A recovery switcher regulates its input voltage, but it does not regulate its output voltage as its primary function.

It would therefore be desirable to provide a more efficient recovery switcher.

It would also be desirable to provide a recovery system that is highly efficiency.

SUMMARY OF THE INVENTION

It is therefore an object of the present invention to provide a more efficient recovery switcher.

It is also an object of the present invention to provide a recovery system that is highly efficient.

The energy recovery system of the present invention includes circuitry that transfers energy from an inductor to a capacitor with reduced power dissipation. A synchronous switching regulator is one application for the recovery system of the present invention. In a synchronous switching regulator, an inductor coupled in the commutation path of the body diode of the synchronous switching transistor may be used to reduce power dissipation caused by reverse recovery current that flows through the body diode of the synchronous switching transistor when the synchronous switching transistor turns OFF.

Energy in the inductor may be transferred back to an input capacitor or to an output capacitor of the switching regulator through a recovery system of the present invention. The recovery circuit of the present invention provides an efficient method for intercepting energy in the inductor, and presenting power to a recovery switcher in a manner that allows the recovery switcher to transfer the energy to the input or output capacitor of the switching regulator efficiently.

The recovery system of the present invention may also be used in a non-synchronous switching regulator. The recovery circuit of the present invention is coupled to an inductor. The inductor is coupled in the commutation path of a diode in the non-synchronous switching regulator. The inductor reduces the reverse recovery current that flows through the diode. The recovery circuit transfers energy from the inductor to the input or output capacitor of the switching regulator.

BRIEF DESCRIPTION OF THE DRAWINGS

The above-mentioned objects and features of the present invention can be more clearly understood from the following detailed description considered in conjunction with the following drawings, in which the same reference numerals denote the same structural elements throughout, and in which.

DETAILED DESCRIPTION OF PREFERRED EMBODIMENTS

Figure 1:
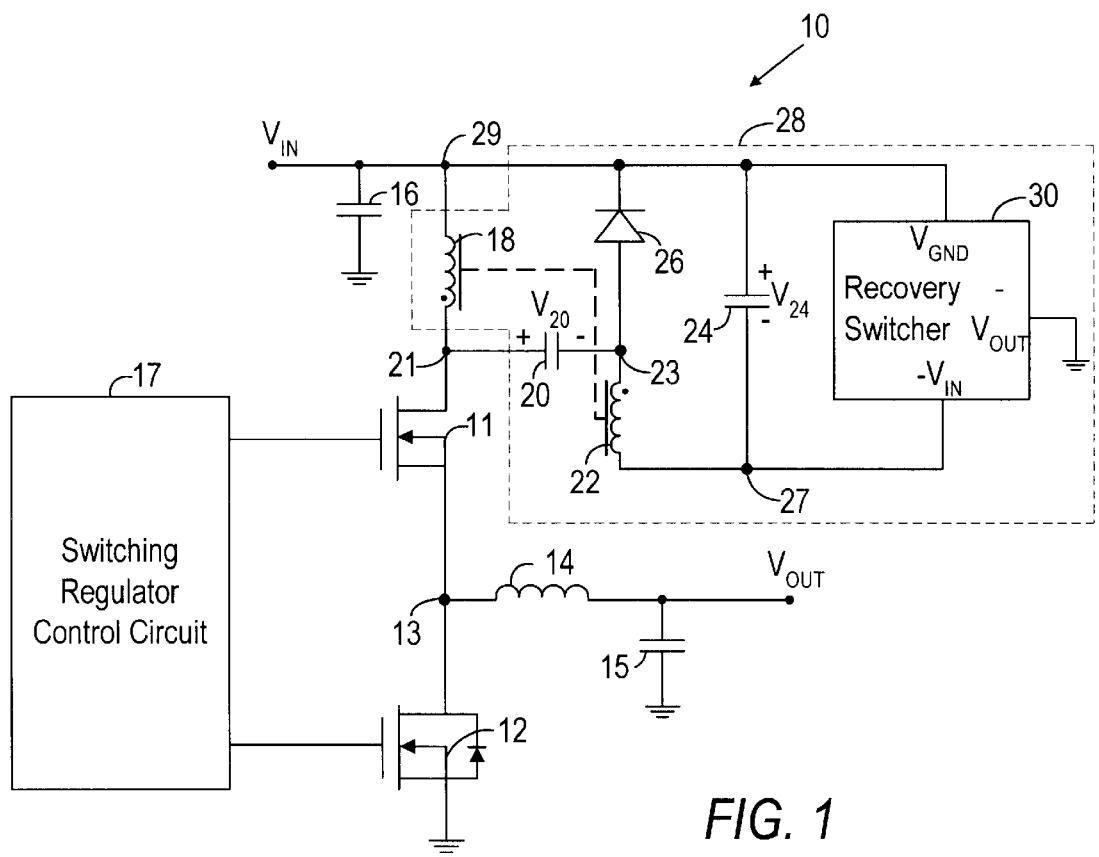
FIG. 1 is a simplified schematic of an exemplary synchronous switching regulator circuit coupled to a recovery circuit in accordance with the principles of the present invention.

Synchronous switching regulator 10 shown in FIG. 1 is an embodiment of the present invention. Synchronous switching regulator 10 includes synchronous switching transistors 11 and 12, main inductor 14, output capacitor 15, input capacitor 16, control circuit 17, and recovery circuit 28. Recovery circuit 28 includes recovery control inductor 18, capacitor 20, inductor 22, diode 26, capacitor 24, and recovery switcher 30. Inductors 18 and 22 may be two windings on the same core or they may be separate inductors. Recovery circuit 28 may be described as a pseudo-SEPIC recovery circuit. For example, inductors 18 and 22 may comprise a transformer or two separate inductors. If inductors 18 and 22 are wound on the same core, the polarity of the voltages induced across inductors 18 and 22 are indicated by the dots shown in FIG. 1. The dotted ends of each inductor have a negative voltage at the same time relative to the other ends of the inductor.

Recovery circuit 28 has an input between nodes 21 and 29 and an output between nodes 29 and ground. Recovery circuit 28 transfers energy from the current stored in inductor 18 to capacitors 20 and 24, and then back to input capacitor 16. Capacitor 24 is coupled across the input of recovery switcher 30 to output node 29. In an alternative embodiment, a recovery circuit of the present invention may transfer energy from an inductor back to an output capacitor of a switching regulator. If desired, a recovery circuit of the present invention may transfer energy to another charge storage circuit. The configuration of recovery circuit 28 provides high efficiency as discussed in further detail below.

Switching regulator 10 is a buck regulator that is coupled to an input voltage source at $V_{IN}$ and a load (not shown) at $V_{OUT}$. Control circuit 17 drives switching transistors 11 and 12 ON and OFF out of phase with each other. A dead time may be included between the ON time of one switching transistor and the ON time of the other switching transistor. During the dead time, both of transistors 11 and 12 are OFF.

Control circuit 17 may be any suitable synchronous switching regulator control circuit. For example, control circuit 17 may be a voltage mode or current mode regulator with feedback loop circuitry such as a resistor divider (not shown) coupled to $V_{OUT}$, and either constant off-time, constant on-time, constant frequency, hysteretic modulation, current modulation, voltage modulation, or pulse width modulation control of the duty cycle of the switching transistors. If control circuit 17 has current mode control, a sense resistor may, for example, be coupled between inductor 14 and capacitor 15. The voltage drop across the sense resistor may be monitored to determine output current. Alternatively, the voltage drop across main inductor 14 or one of switching transistors 11 and 12 may be monitored to sense output current. If desired, other current sense methods may used. Control circuit 17 contains drivers to switch transistors 11 and 12 ON and OFF.

When switching transistor 11 is OFF and switching transistor 12 is ON, current flows from ground through switching transistor 12 and inductor 14 to $V_{OUT}$. When switching transistor 12 turns OFF, current flows through the body diode of transistor 12 to inductor 14 during the dead time. When switching transistor 11 subsequently turns ON, the voltage at node 13 equals the voltage drop of the transistor 12 body diode, and current begins to flow from $V_{IN}$ through inductor 18 and transistor 11 to inductor 14. Current ramps up in inductor 18 according to the equation V=L·(di/dt). As the current in inductor 18 ramps up, there is a corresponding decrease in the current through the transistor 12 body diode. When current through inductor 18 equals the current through inductor 14, the current through the transistor 12 body diode equals zero.

Subsequently, current continues to ramp up in inductor 18. The current through inductor 18 that is in excess of the current through inductor 14 flows from $V_{IN}$ through inductor 18, transistor 11, and the transistor 12 body diode to ground. This current, called a reverse recovery current, removes charge carriers stored in the PN junction of the transistor 12 body diode, causing the body diode to commutate. The body diode is commutated when it blocks reverse current flow through it. Inductor 18 reduces the rate of increase in the reverse recovery current to reduce the peak reverse recovery current used to commutate the body diode of transistor 12 and to reduce power dissipation in transistor 11. Further details of a System and Method for Controlling the Body Diode Reverse Recovery Charge Profile of a Synchronous Switching Transistor are discussed in further detail in commonly-assigned, co-pending U.S. patent application Ser. No. 09/789,960, to Eager et al., filed concurrently herewith, which is hereby incorporated by reference herein in its entirety.

After the transistor 12 body diode commutates, the voltage at node 21 rises. Capacitor 20 and diode 26 comprise an AC coupled loop circuit around inductor 18. Capacitor 20 preferably has a relatively large capacitance value (e.g., 22 $\mu$F), so that the voltage across capacitor 20 $V_{20}$ (which has the polarity shown in FIG. 1) remains relatively constant over time. The voltage at node 23 therefore rises and falls at about the same rate as the voltage at node 21. The voltages at nodes 23 and 27 are less than the voltage $V_{IN}$ across capacitor 16.

When the body diode of transistor 12 commutates, the voltage at node 21 rises. Diode 26 has a turn ON voltage $V_{26}$ (e.g., about 0.6 V). When the voltage at node 21 rises above the voltage at node 29 by an amount greater than $V_{20}+V_{26}$, diode 26 conducts current, and the loop circuit comprising capacitor 20 and diode 26 becomes AC coupled around inductor 18. When the body diode of transistor 12 commutates, reverse recovery current continues to flow in inductor 18, because the current through an inductor cannot change instantaneously. The reverse recovery current flowing through inductor 18 flows through capacitor 20 and diode 26 to $V_{IN}$ after the body diode commutates. Current also flows through inductor 22 into diode 26 in the direction indicated by the coupling polarity of inductor 22 relative to inductor 18.

The reverse recovery current becomes excess energy remaining in inductor 18 after the body diode commutates. This excess energy is transferred from inductor 18 into capacitor 20 directly and into capacitor 24 indirectly through inductor 22 as stored voltages when diode 26 turns ON. The voltage $V_{20}$ on capacitor 20 (and consequently the voltage on capacitor 24) increase slightly (e.g., a few hundred mV) over several switching cycles as energy from inductor 18 is transferred into them.

The current through inductor 18 decreases as the reverse recovery current energy is transferred to capacitors 20 and 24 until the current through inductor 18 equals the current through inductor 14. At this point, the current through diode 26 equals zero. Diode 26 then commutates and blocks reverse current flow. Transistor 11 is still ON at this time.

When control circuit 17 turns OFF switching transistor 11, diode 26 turns ON and conducts current again. Diode 26 and capacitor 20 are AC coupled around inductor 18 again, and the current in inductor 18 flows through capacitor 20 and diode 26. Current also flows in inductor 22 to diode 26. At the time transistor 11 turns OFF, the current in inductor 18 equals the current in inductor 14. The current in inductor 18 comprises energy that is transferred from inductor 18 to capacitors 20 and 24 when switching transistor 11 is OFF. The current through inductor 18 eventually decays to zero. Subsequently, diode 26 commutates again. The voltage $V_{20}+V_{24}$ may increase slightly over time as a result of charge transferred to capacitors 20 and 24 from inductor 18.

Switching regulator 10 provides a highly efficient means for transferring energy in inductor 18 back into input capacitor 16. The energy that is removed from inductor 18 is transferred into capacitors 20 and 24. Some of the energy from inductor 18 is transferred directly into capacitor 20, and some of the energy from inductor 18 is transferred into capacitor 24 through induced current in inductor 22 if inductors 18 and 22 share the same core. The ratio of the energy in inductor 18 that is transferred to capacitor 20 and to capacitor 24 is determined by several circuit characteristics, including, but not limited to the coupling coefficient of inductor 18 to inductor 22 in the event that they are wound on the same core (e.g., as two windings of a transformer). Winding both inductors 18 and 22 on the same core is highly beneficial. This is because the electrical stresses imposed on capacitor 20 and inductor 22 are very sensitive to the coupling coefficient of inductors 18 and 22. Achieving a very high efficiency in circuit 28 is dependent upon the sizing and cost of components, such as capacitor 20 (e.g., 22 $\mu$F) and inductor 22. The coupling factor between inductors 18 and 22 may be, for example, 80%–98%. Other coupling factors may be used.

Referring still to FIG. 1, the voltage on node 23 is slightly below the voltage on node 27 if $V_{20}$ has increased more than $V_{24}$ during the time that diode 26 was conducting. Excess charge that accumulates on capacitor 20 is transferred to capacitor 24 through current in inductor 22. The part of the energy from inductor 18 that is stored in capacitor 20 is transferred to capacitor 24 by pumping action caused by the voltage swing across inductor 18 as the current through it changes over a switching cycle. Diode 26 facilitates this transfer by conducting the average current that flows through inductor 22. Voltage $V_{24}$ across capacitor 24 increases as a result of energy being transferred to it from inductor 18 and capacitor 20.

Recovery switcher 30 then transfers the added charge on capacitor 24 to input capacitor 16. Recovery switcher 30 maintains $V_{24}$ substantially constant by adjusting the amount of charge removed from capacitor 24. $V_{20}$ remains substantially constant over time, because extra charge that is transferred to capacitor 20 is eventually transferred to capacitor 24.

The number of joules of energy transferred from inductor 18 to input capacitor 16 by recovery circuit 28 in each switching cycle is shown by the following equation:

$$J = \frac{1}{2}L_{18}(I_{18})^2 - \frac{1}{2}L_{18}(I_{14A})^2 + \frac{1}{2}L_{18}(I_{14B})^2 \quad (1)$$

where $I_{18}$ equals the current in inductor 18 when the switching transistor 12 body diode commutates, $I_{14A}$ equals the current in inductor 14 when the switching transistor 12 body diode commutates, and $I_{14B}$ equals the current in inductor 18 when switching transistor 11 turns OFF. If desired, capacitor 20 may be eliminated from circuit 28 if inductors 18 and 22 are transformer coupled and have a unity coupling factor. In addition, diode 26 may be replaced with a transistor such as a MOSFET that is operated like a diode or a switch.

Figure 2:
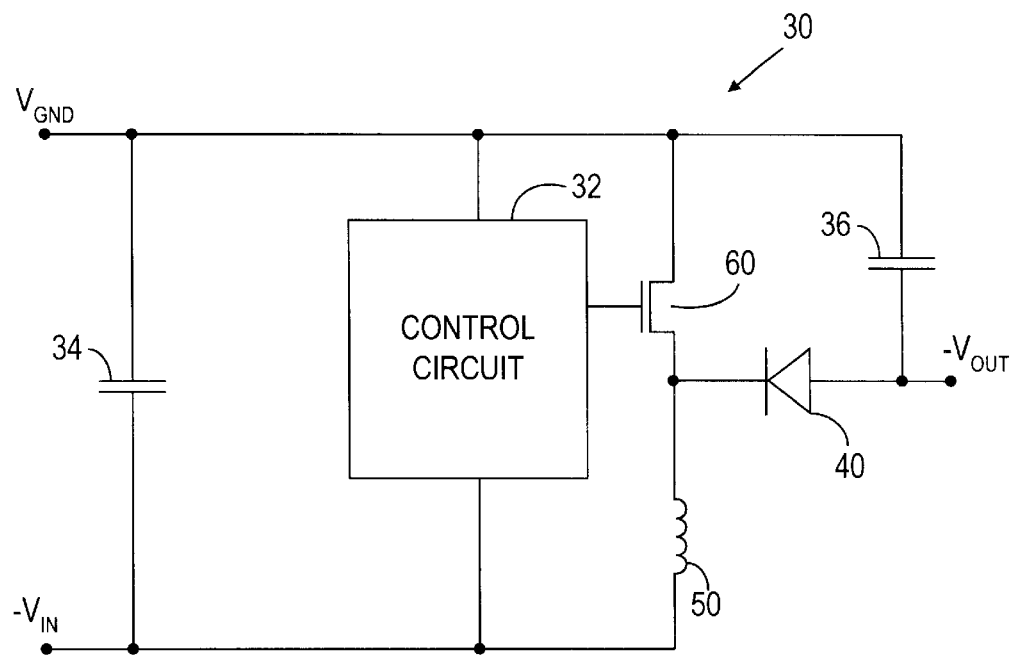
FIG. 2 is a simplified schematic of an illustrative recovery switcher circuit in accordance with the principles of the present invention.

A recovery switcher is a switching regulator circuit that transfers energy from an input to an output, but does not regulate its output voltage as its primary function. An example of recovery switcher 30 is illustrated in FIG. 2. In the example of FIG. 2, recovery switcher 30 includes control circuit 32, capacitor 34, capacitor 36, diode 40, inductor 50, and switch 60. Control circuit 32 may be any standard voltage or current mode switching regulator control circuit. Switch 60 may be a switching transistor such as a MOSFET. The common ground point for recovery switcher 30 is arbitrarily selected to be $V_{GND}$, which equal $V_{IN}$ in FIG. 1. The input voltage $-V_{IN}$ of recovery switcher 30 is negative, because it is less than $V_{GND}$. The output voltage $-V_{OUT}$ of recovery switcher 30 is negative, because it is less than the selected ground voltage $V_{GND}$. Voltage $-V_{OUT}$ equals the common ground voltage of FIG. 1. Switching regulator 30 is configured as a boost regulator because the voltage $(V_{GND}-(-V_{IN}))$ is less than the voltage $(V_{GND}-(-V_{OUT}))$ $V_{24}$ in FIG. 1 equals $(V_{GND}-(-V_{IN}))$ Control circuit 32 includes drive circuitry that controls the opening and closing of switch 60. When control circuit 32 closes switch 60, the voltage different between $V_{GND}$ and $-V_{IN}$ appears across inductor 50, and the instantaneous current through inductor 50 begins to increase. When control circuit 32 opens switch 60, the voltage difference between $-V_{OUT}$ and $-V_{IN}$ (minus the diode voltage drop of diode 40) appears across inductor 50, and the instantaneous current through inductor 50 begins to decrease, because $-V_{OUT}$ is less than $V_{GND}$.

Control circuit 32 monitors the voltages $-V_{IN}$ and $V_{GND}$. Control circuit 32 sets the ON time or the duty cycle of switch 60 based upon the voltage differential between $V_{GND}$ and $-V_{IN}$. As $V_{24}$ begins to increase when charge is transferred to capacitors 24 and 34, control circuit 32 increases the ON time or the duty cycle of switch 60. The average current through inductor 50 over at least one cycle increases to prevent $V_{24}$ from increasing and to maintain it at a substantially constant value. Thus, when $V_{24}$ increases slightly as charge is transferred to it from inductor 18 and capacitor 20, more charge is removed from capacitors 24 and 34 through inductor 50 to discharge capacitors 24/34 and to maintain voltage $V_{24}$ across capacitors 24/34 at a substantially constant value. The charge removed from capacitors 24 and 34 is ultimately transferred to input capacitor 16. Thus, as capacitors 24 and 34 discharge, capacitor 16 charges. Energy is thereby transferred from capacitor 24 back to $V_{IN}$ at capacitor 16.

The recovery power $P_R$ is defined as the time averaged energy removed from inductor 18 via the recovery circuit scaled to watts by looking at the energy across a one second interval, as shown in the following equation:

$$P_R = J \times f_{10} \quad (2)$$

where J is defined in equation (1) and $f_{10}$ is the switching frequency of switching regulator 10.

Figure 3:
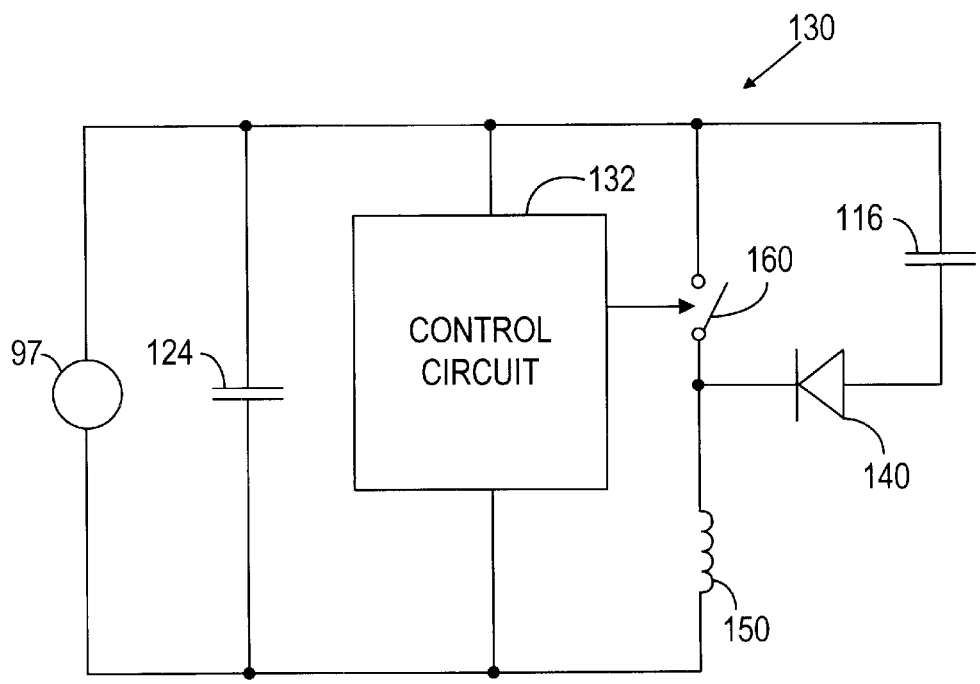
FIG. 3 is a simplified schematic of a illustrative recovery switcher circuit system in accordance with the principles of the present invention.

FIG. 3 is a schematic of an idealized embodiment of a recovery switcher of the present invention. Components 132, 140, 150, and 160 are the same as components 32, 40, 50, and 60 in FIG. 2, respectively. Capacitor 124 incorporates capacitors 24 of FIG. 1 and 34 of FIG. 2. Capacitor 116 incorporates capacitor 16 of FIG. 1 and capacitor 36 of FIG. 2. Recovery power source 97 provides a power $P_R$ from circuit 28 as defined in equation (2). All of the energy J from inductor 18 defined in equation (1) is transformed into the power of power source 97, assuming that inductor 18, capacitor 20, diode 26, and inductor 22 are ideal components that dissipate no energy.

Over an arbitrary period of time, the power of power source 97 is transferred to capacitor 124 and to capacitor 116. In an ideal circuit, recovery switcher 130 is 100% efficiency in that it transfers all of the energy received from power source 97 to capacitor 116. In a real circuit, however, losses are typically present. When switch 160 is open and the current in inductor 150 equals zero, all of the energy exiting power source 97 is transferred into capacitor 124 causing the voltage across the terminals of capacitor 124 to increase. When the voltage across capacitor 124 reaches a range of voltage set by the control function of control circuit 132, a time sequence of closing and opening switch 160 is produced. The time sequence may be, for example, the duty cycle of switch 160, the ON time of switch 160, or the OFF time of switch 160. This time sequence is a function of several factors including the voltage across capacitor 124, time, and in some cases the current flowing through one or more of the recovery power path components such as switch 160, inductor 150, and diode 140. The time sequence control of switch 160 may or may not have a frequency or phase relationship to the opening and closing of the switches 11 and 12 of FIG. 1. If desired, diode 140 may be replaced with a synchronous switching transistor that is synchronously switched out of phase with switch 160 by control circuit 132.

During the time that recovery switch 160 is closed, energy is transferred from the input system (comprising power source 97 and capacitor 124) into recovery inductor 150. While the recovery switch 160 is closed, the voltage across the input system can be rising, holding steady, or falling depending on the difference between the currents flowing out of power source 97, and the current flowing into inductor 150.

During the time that recovery switch 160 is open and current is flowing in inductor 150, the current path comprises capacitor 124, capacitor 116, and diode 140. An important advantage of this embodiment is the fact that while recovery switch 160 is open and there is current flowing in inductor 150, the current is flowing through capacitor 124 and capacitor 116 in a direction that is discharging capacitor 124 and charging capacitor 116. Thus, energy is being removed from the input system all of the time that current is flowing in recovery inductor 150 regardless of whether the recovery switch 160 is open or closed.

The recovery system of the present invention provides an efficient method of intercepting energy from inductor 18 while limiting the maximum voltage that switch 11 has to block, and presenting the output power to the recovery switcher in a manner that allows it to transfer energy into the main input capacitor 16 efficiently. Recovery circuit 28 may be several times more efficient than a standard recovery switcher.

Figure 4:
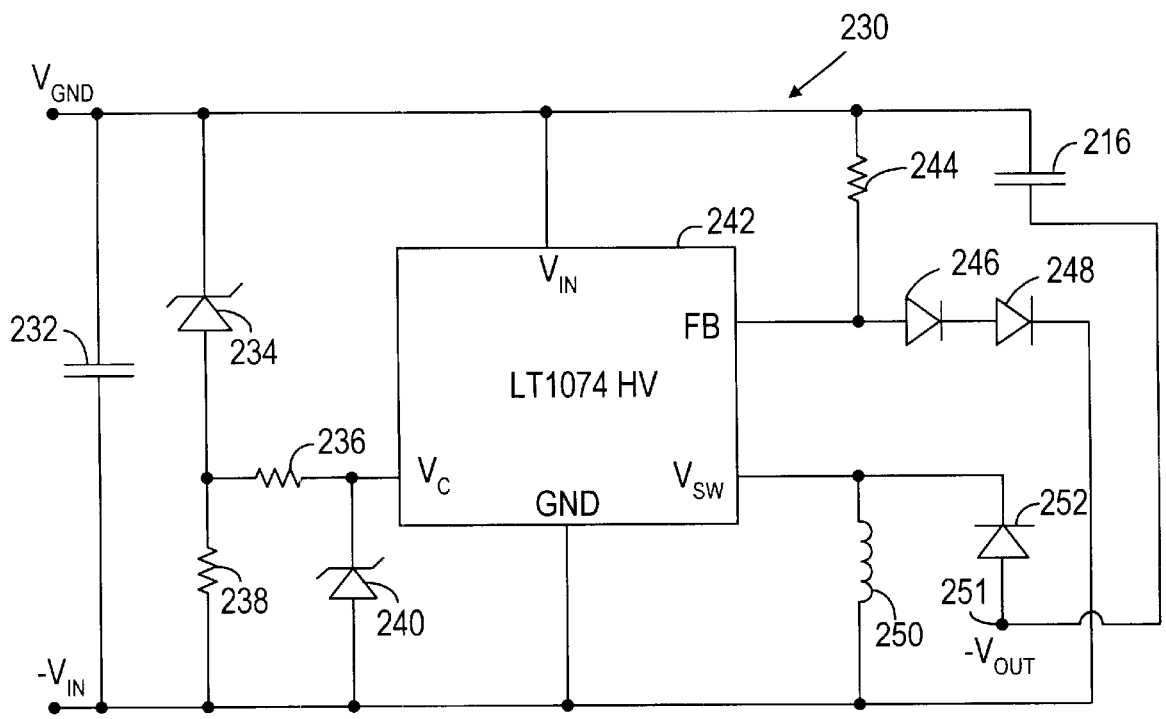
FIG. 4 is a simplified schematic of another exemplary recovery switcher circuit in accordance with the principles of the present invention.

Switching regulator 230 shown in FIG. 4 is another example of recovery switcher 30. Recovery switcher 230 includes capacitors 232 and 216, resistors 236, 238, and 244, inductor 250, zener diodes 234 and 240, diodes 246, 248, and 252, and switching regulator 242. Switching regulator 242 may include any standard switching regulator such as, for example, a high-voltage LT1074 integrated circuit. Details of the LT1074 circuit are shown and discussed in the 1994 LT1074 datasheet, which is hereby incorporated by reference in its entirety. As is apparent to one of skill in the art, switching regulator 242 may also include other suitable switching regulator circuits. Switching regulator 230 is configured as a boost regulator because $-V_{IN}$ is less than $-V_{OUT}$.

The LT1074 switching regulator 242 includes a switching transistor coupled between its $V_{IN}$ and $V_{SW}$ pins. The switching transistor is turned ON and OFF by a voltage mode control circuit in regulator 242. If desired, a switching regulator circuit with current mode control may be used instead. When the switching transistor turns ON, the instantaneous current through inductor 250 increases. When the switching transistor turns OFF, the instantaneous current through inductor 250 decreases. The voltage difference between the $V_c$ pin of regulator 242 and the voltage $-V_{IN}$ at the GND pin of regulator 242 controls the duty cycle and the ON time of the switching transistor.

Resistor 244, diode 246, and diode 248 disable the frequency shift feature of the LT1074 by setting the voltage at the FB pin to between 1.5 and 2.21 volts. Resistor 236 and zener diode 240 are present for protection to the LT1074's $V_c$ pin in the event that the voltage across capacitor 232 inadvertently gets too high.

Current flows from $V_{GND}$ to $-V_{IN}$ as reverse current through zener diode 234 and resistor 238. The voltage at the $V_c$ pin equals $V_{GND}$ minus the breakdown voltage of zener diode 234. As voltage $V_{24}$ in FIG. 1 increases slightly when energy is transferred from inductor 18 to capacitor 24, the voltage differential between $V_c$ and $-V_{IN}$ increases. Switching regulator 242 responds by increasing the ON time or duty cycle of its switching transistor, and the average inductor current through inductor 250 increases. Energy is removed from capacitors 232 and 24 through inductor 250. Thus, when $V_{24}$ increases slightly, more energy is removed from capacitors 24 and 232 through inductor 250 to discharge capacitors 24 and 232 and to maintain voltage $V_{24}$ across capacitors 24 and 232 at a substantially constant value. The charge removed from capacitors 24 and 232 is transferred to capacitors 16 and 216. Thus, as capacitors 24 and 232 discharge, capacitors 16 and 216 charge. Energy is thereby transferred from capacitor 24 back to $V_{IN}$ at capacitor 16.

In a further embodiment of the present invention, recovery circuit 28 may be coupled to a non-synchronous switching regulator circuit. For example, synchronous switching transistor 12 in FIG. 1 may be replaced with a diode so that circuit 10 becomes a non-synchronous switching regulator. Recovery circuit 28 then operates as discussed above with respect to FIG. 1, except that inductor 18 is now coupled in the commutation path of the non-synchronous diode, and inductor 18 reduces the reverse recovery current in the non-synchronous diode.

Persons skilled in the art further will recognize that the circuitry of the present invention may be implemented using circuit configurations other than those shown and discussed above. For example, the recovery circuit of the present invention may be coupled to a boost switching regulator, a buck-boost switching regulator, or other type of switching regulator. All such modifications are within the scope of the present invention, which is limited only by the claims which follow.

What is claimed is:

1. A method for transferring energy to a first capacitor, the first capacitor that is coupled to the input of a switching regulator, the method comprising:
   reducing a reverse recovery current in a first diode of the switching regulator using a first inductor; and
   transferring charge from the first inductor to the first capacitor that is coupled to the input of the switching regulator.

2. The method of claim 1 further comprising:
   transferring charge from the first inductor to a second capacitor coupled to the first inductor.

3. The method of claim 2 further comprising:
   transferring charge from the second capacitor to the first capacitor.

4. The method of claim 3 wherein transferring charge from the first inductor to the first capacitor comprises transferring charge to the first capacitor using a second inductor and a switch circuit.

5. The method of claim 4 wherein the first and second inductors comprise two windings on the same core.

6. The method of claim 4 wherein the switch circuit is a diode.

7. The method of claim 1 further comprising:
   transferring energy from the first capacitor to a second capacitor using a recovery switcher.

8. The method of claim 7 wherein the recovery switcher comprises a switching transistor, a diode, a inductor, and a control circuit that controls the switching transistor.

9. The method of claim 8 wherein the timing sequence of the switching transistor is determined by the voltage on the first capacitor.

10. A recovery system incorporated into a switching regulator, the recovery circuit comprising:
    a first inductor coupled in the commutation path of a first diode of the switching regulator, wherein the switching regulator is a synchronous switching regulator with a first switching transistor coupled to an input voltage and coupled to a second switching transistor, and the first inductor is coupled between the first switching transistor and the input voltage;
    a second inductor; and
    a first capacitor coupled to the second inductor through a switch circuit.

11. The recovery system of claim 10 further comprising a second capacitor coupled between the first and second inductors.

12. The recovery system of claim 10 wherein the switch circuit comprises a second diode.

13. The recovery system of claim 10 wherein the first and second inductors comprise two windings on the same core.

14. The recovery system of claim 10 wherein the first diode is a body diode of a synchronous switching transistor in the switching regulator.

15. The recovery system of claim 10 wherein the second switching transistor is coupled to ground.

16. The recovery system of claim 10 wherein the switching regulator is a non-synchronous switching regulator.

17. The recovery system of claim 10 further comprising a recovery switcher coupled to the first capacitor.

18. The recovery system of claim 17 wherein the recovery switcher comprises a switching transistor, a third inductor a second diode, and a control circuit.

19. The recovery system of claim 17 wherein the recovery switcher transfers charge from the first capacitor to a second capacitor.

20. A recovery system incorporated into a switching regulator, the recovery circuit comprising:
 means for reducing a reverse recovery current in a first diode of the switching regulator; and
 means for transferring charge from the means for reducing the reverse recovery current to a first capacitor by an inductor coupled between a switching transistor of the switching regulator and an input capacitor of the switching regulator.

21. The recovery system of claim 20 wherein the switching regulator is a non-synchronous switching regulator.

22. The recovery system of claim 20 further comprising:
 means for transferring charge on the first capacitor to an input capacitor or an output capacitor of the switching regulator.

23. The recovery system of claim 22 wherein the means for transferring charge on the first capacitor to the input capacitor or the output capacitor of the switching regulator comprises a switching transistor, an inductor, and a control circuit that switches the switching transistor.

24. The recovery system of claim 20 wherein means for transferring charge from the means for reducing the reverse recovery current to the first capacitor comprises a second inductor coupled to the first capacitor and a second diode.

25. The recovery system of claim 24 wherein means for transferring charge from the means for reducing the reverse recovery current to the first capacitor further comprises a third capacitor coupled between the first and second inductors.

26. The recovery system of claim 24 wherein the first and second inductors comprise windings on the same core.

27. The recovery system of claim 20 wherein the switching regulator is a synchronous switching regulator.

28. A switching regulator circuit with a recovery system, comprising:
 an input capacitor;
 a first switching transistor switched by a control circuit;
 a first inductor coupled to the first switching transistor and the input capacitor;
 a second inductor coupled to the first switching transistor;
 an output capacitor coupled to the second inductor;
 a third inductor;
 a third capacitor coupled to the third inductor through a switch circuit; and
 a recovery switcher coupled to the third capacitor and the input capacitor or the output capacitor of the switching regulator.

29. The switching regulator circuit of claim 28 further comprising a second switching transistor that is synchronously switched by the control circuit.

30. The switching regulator circuit of claim 28 wherein the first and third inductors comprise two windings on the same core.

31. The switching regulator circuit of claim 28 wherein the recovery switcher comprises a second switching transistor, a diode, a fourth inductor, and a second control circuit that controls the second switching transistor.

32. The switching regulator circuit of claim 28 wherein the switch circuit comprises a diode coupled to the third inductor.

33. The switching regulator circuit of claim 28 further comprising a fourth capacitor coupled between the first and second inductors.

34. A method for transferring energy to a first capacitor in a switching regulator, the method comprising:
 reducing a reverse recovery current in a first diode of the switching regulator using a first inductor;
 transferring charge from the first inductor to the first capacitor by transferring charge to the first capacitor using a second inductor and a switch circuit;
 transferring charge from the first inductor to a second capacitor coupled to the first inductor; and
 transferring charge from the second capacitor to the first capacitor.

35. The method of claim 34 further comprising:
 transferring energy from the first capacitor to a second capacitor using a recovery switcher.

36. The method of claim 35 wherein the recovery switcher comprises a switching transistor, a diode, a inductor, and a control circuit that controls she switching transistor.

37. The method of claim 36 wherein the timing sequence of the switching transistor is determined by the voltage on the first capacitor.

38. The method of claim 34 wherein the first and second inductors comprise two windings on the same core.

39. The method of claim 34 wherein the switch circuit is a diode.

40. A method for transferring energy to a first capacitor in a switching regulator, the method comprising:
 reducing a reverse recovery current in a first body diode of a transistor of the switching regulator using first inductor; and
 transferring charge from the first inductor to the first capacitor.

41. The method of claim 40 further comprising:
 transferring energy from the first capacitor to a second capacitor using a recovery switcher.

42. The method of claim 41 wherein the recovery switcher comprises a switching transistor, a diode, a inductor, and a control circuit that controls the switching transistor.

43. The method of claim 42 wherein the timing sequence of the switching transistor is determined by the voltage on the first capacitor.

44. The method of claim 40 further comprising;
 transferring charge from the first inductor to a second capacitor coupled to the first inductor.

45. The method of claim 44 further comprising;
 transferring charge from the second capacitor to the first capacitor.

46. The method of claim 45 wherein transferring charge from the first inductor to the first capacitor comprises transferring charge to the first capacitor using a second inductor and a switch circuits.

47. The method of claim 46 wherein the first and second inductors comprise two windings on the same core.

48. The method of claim 46 wherein the switch circuit is a diode.

49. A method for transferring energy to a first capacitor in a switching regulator, the method comprising:
 reducing a reverse recovery current in a first diode of the switching regulator using a first inductor that is coupled between an input source and the first diode; and
 transferring charge from the first inductor to the input first capacitor using it second inductor that is coupled to the first inductor through a second capacitor.

50. The method of claim 49 further comprising:
 transferring energy from the first capacitor to the second capacitor using a recovery switcher.

51. The method of claim 50 wherein the recovery switcher comprises switching transistor, a diode, an inductor, and a control circuit that controls the switching transistor.

52. The method of claim 51 wherein the timing sequence for the switching transistor is determined by the voltage on the first capacitor.

53. The method of claim 49 further comprising:
transferring charge from the first inductor to the second capacitor.

54. The method of claim 53 further comprising:
transferring charge from the second capacitor to the first capacitor.

55. The method of claim 54 wherein transferring charge from the first inductor to the first capacitor using the second inductor also comprises transferring charge to the first capacitor using a switch circuit.

56. The method of claim 55 wherein the first and second inductors comprise two windings on the same core.

57. The method of claim 55 wherein the switch circuit is a diode.

* * * * *